(12) United States Patent
Umeda et al.

(10) Patent No.: US 11,075,091 B2
(45) Date of Patent: Jul. 27, 2021

(54) METHOD FOR MANUFACTURING SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Takenori Ishioka, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 10 days.

(21) Appl. No.: 16/630,974

(22) PCT Filed: Oct. 26, 2017

(86) PCT No.: PCT/JP2017/038756
§ 371 (c)(1),
(2) Date: Jan. 14, 2020

(87) PCT Pub. No.: WO2019/082344
PCT Pub. Date: May 2, 2019

(65) Prior Publication Data
US 2020/0227279 A1    Jul. 16, 2020

(51) Int. Cl.
*H01L 23/00* (2006.01)
*H01L 23/495* (2006.01)
(Continued)

(52) U.S. Cl.
CPC ........ *H01L 21/4853* (2013.01); *H01L 21/485* (2013.01); *H01L 21/4842* (2013.01);
(Continued)

(58) Field of Classification Search
CPC ......... H01L 23/49565; H01L 23/49551; H01L 2224/32257; H01L 21/4853; H01L 21/485;
(Continued)

(56) References Cited

U.S. PATENT DOCUMENTS 5,391,439 A * 2/1995 Tomita ................. H05K 3/3426
428/571
7,821,111 B2 * 10/2010 Tellkamp ............. H05K 3/3426
257/666
(Continued)

FOREIGN PATENT DOCUMENTS

JP    H01100957 A    4/1989
JP    H06181276 A    6/1994
(Continued)

OTHER PUBLICATIONS

International Application No. PCT/JP2017/038756, International Search Report, dated Jan. 16, 2018.
(Continued)

*Primary Examiner* — David Vu
*Assistant Examiner* — Brandon C Fox
(74) *Attorney, Agent, or Firm* — Marshall, Gerstein & Borun LLP

(57) ABSTRACT

In a first step of a method of manufacturing a semiconductor device, a portion to be the first lead frame is formed by selectively punching a metal plate, furthermore, notch portions depressed in the reference direction are formed on both side surfaces of a portion, of the first lead frame where the first bent portion is formed, in line contact with the first conductive layer in the reference direction; in the second step of the method, a first bent portion is formed by bending the one end of the first lead frame so as to protrude downward along the reference direction; and in the third step
(Continued)

of the method, the upper surface of the first conductive layer and the lower surface of the first bent portion of the first lead frame are joined at the end of the substrate, by the first conductive bonding material, furthermore, the upper surface of the first conductive layer and the notch portions of the first bent portion are joined, by embedding a part of the first conductive bonding material in the notch portions.

15 Claims, 16 Drawing Sheets

(51) Int. Cl.
  *H01L 21/48* (2006.01)
  *H01L 21/60* (2006.01)
  *H01L 21/56* (2006.01)
  *H01L 21/8234* (2006.01)

(52) U.S. Cl.
  CPC .......... *H01L 21/56* (2013.01); *H01L 21/8234* (2013.01); *H01L 23/49551* (2013.01); *H01L 23/49565* (2013.01); *H01L 2021/6027* (2013.01); *H01L 2224/32257* (2013.01)

(58) Field of Classification Search
  CPC .. H01L 21/4842; H01L 21/56; H01L 21/8234
  USPC .......................................... 257/676; 438/612
  See application file for complete search history.

(56) References Cited

U.S. PATENT DOCUMENTS

| 2016/0284632 | A1 | 9/2016 | Shinohara et al. |
| 2016/0336257 | A1* | 11/2016 | Choi ........................ H01L 24/37 |
| 2017/0025331 | A1 | 1/2017 | Kamiyama et al. |
| 2019/0139866 | A1* | 5/2019 | Ku Raya ................. H01L 24/84 |

FOREIGN PATENT DOCUMENTS

| JP | 2002-299541 A | 10/2002 |
| JP | 2009-049272 A | 3/2009 |
| JP | 2015-12065 A | 1/2015 |
| JP | 2015026791 A | 2/2015 |
| JP | 2015-090965 A | 5/2015 |
| JP | 2017-174927 A | 9/2017 |
| WO | WO-2016/084483 | 6/2016 |

OTHER PUBLICATIONS

International Application No. PCT/JP2017/038756, International Preliminary Report on Patentability, dated May 7, 2020.
Supplementary European Search Report for Application No. 17930123.9, dated Jul. 20, 2020.

* cited by examiner

METHOD FOR MANUFACTURING SEMICONDUCTOR DEVICE

TECHNICAL FIELD

The present invention relates to a method of manufacturing a semiconductor device.

BACKGROUND ART

Conventionally, for example, a semiconductor device in which a semiconductor element is placed on a conductor layer of a substrate is known (see Patent Document 1) In this semiconductor device, the semiconductor element and the lead frame are joined with a connector via a conductive joining material such as solder, and the semiconductor element and the substrate are sealed with a sealing resin.

In such a conventional semiconductor device, when thermal stress is applied to the semiconductor device, the stress is generated in the joint portion of the lead frame, thereby reducing the reliability of electrical connection of the joint portion.

Here, as a conventional method of manufacturing a semiconductor device, for example, as shown in FIGS. 14A and 14B, there is a method of ensuring a predetermined thickness of a solder material at a joint to which stress is applied, by coining the tip of the lead frame.

This conventional method of manufacturing a semiconductor device requires a total of four processes including: a preliminary punching process for the metal plate, a coining process for the tip of the lead frame, a process for punching the outer shape of the metal plate, and a bending process for the lead frame. As a result, there is a problem that the manufacturing cost of the semiconductor device increases.

PRIOR ART DOCUMENT

P2015-12065

DISCLOSURE OF THE INVENTION

Problem to be Solved by the Invention

Therefore, an object of the present invention is to provide a method of manufacturing a semiconductor device that can easily form a lead frame and reduce manufacturing costs, and that can improve the reliability of the joint by relaxing the stress generated at the joint between the lead frame and the substrate.

Solution to Problem

A method of manufacturing a semiconductor device according to the embodiment of one aspect of the present invention, the semiconductor device comprising: a substrate on which a plurality of conductive layers are provided; a semiconductor element that has a first terminal on a lower surface side of the semiconductor element, the first terminal electrically connected to a first conductive layer provided on a upper surface of the substrate; a sealing portion that seals the substrate and the semiconductor element; a first lead frame that has one end portion contacting the upper surface of the first conductive layer at an end extending in a side direction of the upper surface of the substrate in the sealing portion, and has the other end portion exposed from the sealing portion; a first conductive bonding material that bonds between the upper surface of the first conductive layer and the lower surface of the one end of the first lead frame at the end of the substrate, and that has electrical conductivity; wherein the one end portion of the first lead frame has a first bent portion bent so as to protrude downward along a reference direction, and wherein in a first step of the method, a portion to be the first lead frame is formed by selectively punching a metal plate, furthermore, notch portions depressed in the reference direction are formed on both side surfaces of a portion, of the first lead frame where the first bent portion is formed, in line contact with the first conductive layer in the reference direction; in the second step of the method, a first bent portion is formed by bending the one end of the first lead frame so as to protrude downward along the reference direction; and in the third step of the method, the upper surface of the first conductive layer and the lower surface of the first bent portion of the first lead frame are joined at the end of the substrate, by the first conductive bonding material, furthermore, the upper surface of the first conductive layer and the notch portions of the first bent portion are joined, by embedding a part of the first conductive bonding material in the notch portions.

In the method of manufacturing the semiconductor device, wherein a lower surface of the first bent portion is in line contact with an upper surface of the first conductive layer in the reference direction.

In the method of manufacturing the semiconductor device, wherein the first conductive bonding material is disposed along the reference direction in which the first bent portion of the first lead frame is in line contact with the upper surface of the first conductive layer, and wherein the first conductive bonding material bonds the upper surface of the first conductive layer and the lower surface of the first bent portion at the end of the substrate.

In the method of manufacturing the semiconductor device, wherein the first lead frame is arranged, such that the side direction in which the end of the substrate extends and the reference direction in which a line contact region of the first bent portion extends are parallel to each other.

In the method of manufacturing the semiconductor device, wherein the first lead frame has a main body located between the one end and the other end of the first lead frame, and the main body sealed in the sealing portion.

In the method of manufacturing the semiconductor device, wherein the one end and the other end of the first lead frame have the same thickness.

In the method of manufacturing the semiconductor device, wherein the first conductive bonding material is a solder material.

In the method of manufacturing the semiconductor device, the semiconductor device further comprises: a second lead frame that has one end in contact with the upper surface of a second conductive layer provided on the end of the upper surface of the substrate in the sealing portion, and that has the other end exposed from the sealing portion; a second conductive bonding material that bonds between the first conductive layer and the one end of the second lead frame at the end of the substrate, and the second conductive bonding material having electric conductivity; and a connector that electrically connects between the second conductive layer and a second terminal on the upper surface side of the semiconductor element is further provided.

In the method of manufacturing the semiconductor device, wherein the semiconductor device is a MOSFET having the first terminal that is a drain terminal, the second terminal is a gate terminal, and a source terminal, which is a third terminal having an area larger than the second terminal, the source terminal provided on an upper surface of the MOSFET.

In the method of manufacturing the semiconductor device, wherein a width of the one end of the first lead frame in the reference direction is larger than a width of the one end of the second lead frame in the reference direction.

In the method of manufacturing the semiconductor device, the semiconductor device further comprises a third lead frame that has one end electrically connected to the third terminal of the substrate in the sealing portion, and that has the other end exposed from the sealing portion.

In the method, of manufacturing the semiconductor device, wherein the one end portion of the first lead frame further includes a first arch provided so as to protrude upward along the reference direction, and wherein the first bent portion is connected to the first arch portion and is located closer to the tip end of the one end portion of the first lead frame than the first arch portion.

In the method of manufacturing the semiconductor device, wherein a width of the first arch portion in the side direction is the same as a width of the first bent portion in the side direction other than the cutout portion.

In the method of manufacturing the semiconductor device, wherein the first arch portion suppresses application of stress to the first bent portion of the first lead frame, by releasing the stress applied to the first lead frame to the surrounding sealing portion.

In the method of manufacturing the semiconductor device, wherein a position of the upper surface of the first arch portion is higher than the position of the upper surface of the main body portion, and wherein a position of a lower surface of the first bent portion is lower than a position of a lower surface of the main body.

Effects of the Invention

The method of manufacturing a semiconductor device according to one embodiment of the present invention, the semiconductor device includes: a substrate on which a plurality of conductive layers are provided; a semiconductor element that has a first terminal on a lower surface side of the semiconductor element, the first terminal electrically connected to a first conductive layer provided on a upper surface of the substrate; a sealing portion that seals the substrate and the semiconductor element; a first lead frame that has one end portion contacting the upper surface of the first conductive layer at an end extending in a side direction of the upper surface of the substrate in the sealing portion, and has the other end portion exposed from the sealing portion; a first conductive bonding material that bonds between the upper surface of the first conductive layer and the lower surface of the one end of the first lead frame at the end of the substrate, and that has electrical conductivity; wherein the one end portion of the first lead frame has a first bent portion bent so as to protrude downward along a reference direction, The method of manufacturing a semiconductor device according to one embodiment of the present invention, wherein in a first step of the method, a portion to be the first lead frame is formed by selectively punching a metal plate, furthermore, notch portions depressed in the reference direction are formed on both side surfaces of a portion, of the first lead frame where the first bent portion is formed, in line contact with the first conductive layer in the reference direction; in the second step of the method, a first bent portion is formed by bending the one end of the first lead frame so as to protrude downward along the reference direction; and in the third step of the method, the upper surface of the first conductive layer and the lower surface of the first bent portion of the first lead frame are joined at the end of the substrate, by the first conductive bonding material, furthermore, the upper surface of the first conductive layer and the notch portions of the first bent portion are joined, by embedding a part of the first conductive bonding material in the notch portions.

Thus, in the method of manufacturing a semiconductor device of the present invention, two steps, that are a process of selectively punching a metal plate and a process of bending one end of the first lead frame, are sufficient as the step of forming the first lead frame L1. For this reason, manufacturing costs can be reduced.

Further, a predetermined thickness of the first conductive bonding material is secured on an outer peripheral portion of a bonding portion between the lead frame and the substrate. For this reason, when thermal stress is applied, the stress generated in the joint can be reduced. In particular, the tip of the first lead frame to be bonded to the substrate is bent to form a first bent portion, and the first bent portion is in line contact with the substrate. For this reason, it becomes possible to ensure a predetermined thickness of the first conductive bonding material around the bonding portion.

Furthermore, a part of the first conductive bonding material is embedded in the notch portion. Thereby, the upper surface of the first conductive layer and the cutout portion of the first bent portion are joined. Thereby, fixation by solder can be ensured.

That is, in the method of manufacturing a semiconductor device of the present invention, the stress generated at the joint between the lead frame and the substrate can be relaxed, and the reliability of the joint can be improved. Furthermore, the lead frame can be easily formed and the manufacturing cost can be reduced.

EMBODIMENTS FOR CARRYING OUT THE INVENTION

Embodiments of the present invention will now be described with reference to the accompanying drawings.

Embodiment

Figure 1:
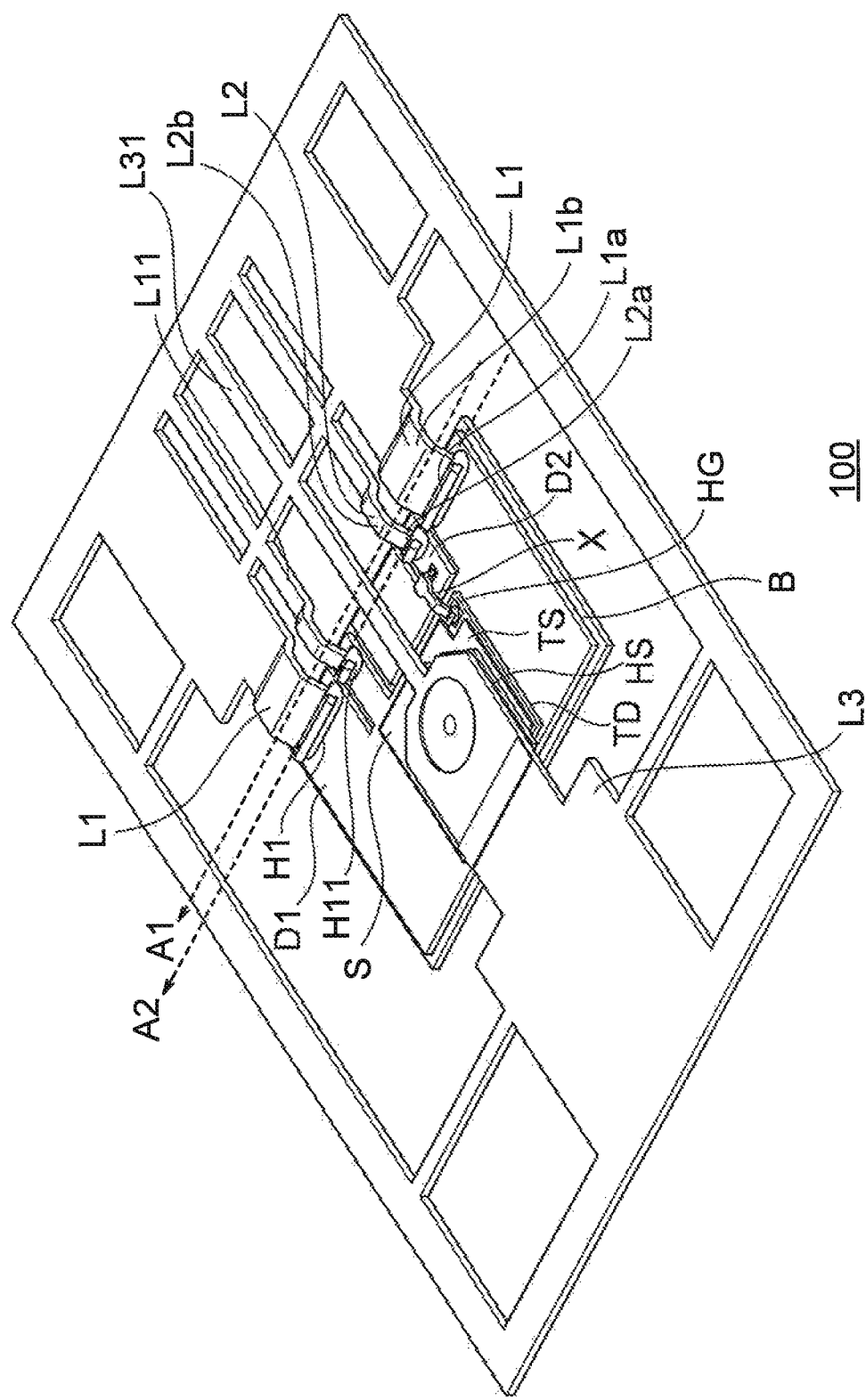
FIG. 1 is a perspective view showing an example of a configuration of a semiconductor device 100 before sealing.
Figure 2:
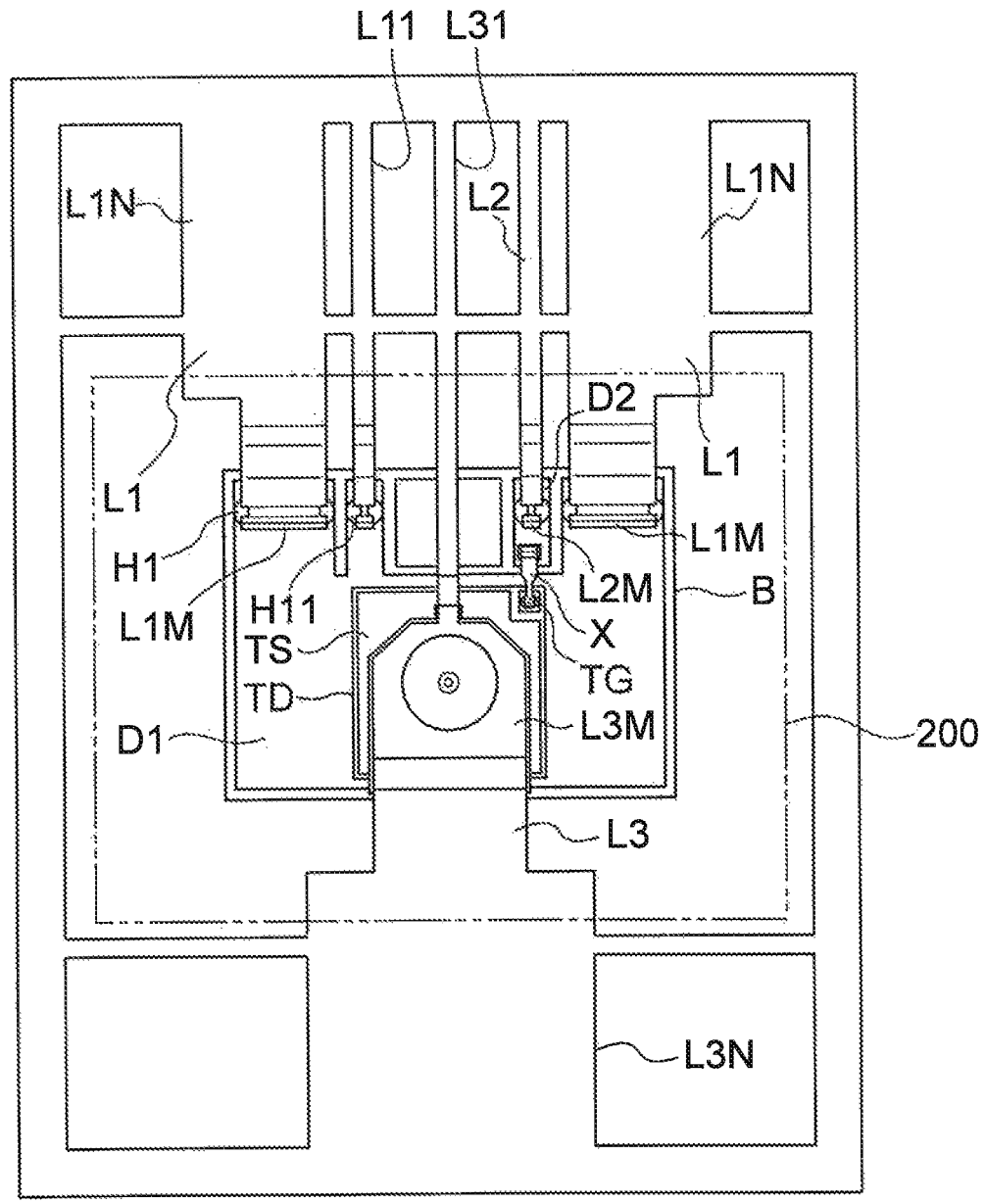
FIG. 2 is a top view showing an example of the configuration of the semiconductor device 100 after sealing and before cutting the lead frame.
Figure 3:
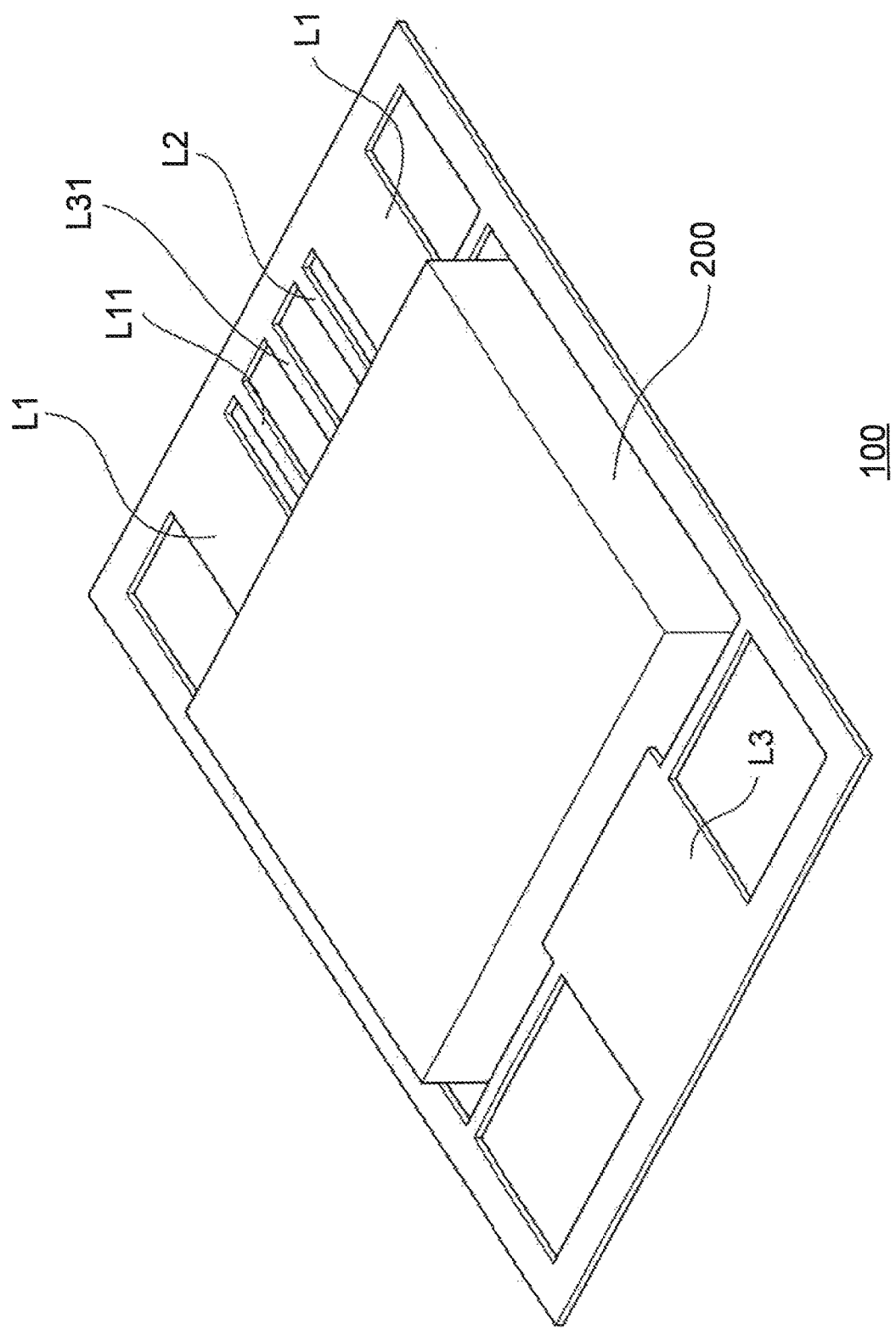
FIG. 3 is a perspective view showing an example of the configuration of the semiconductor device 100 after sealing and before cutting the lead frame.
Figure 4:
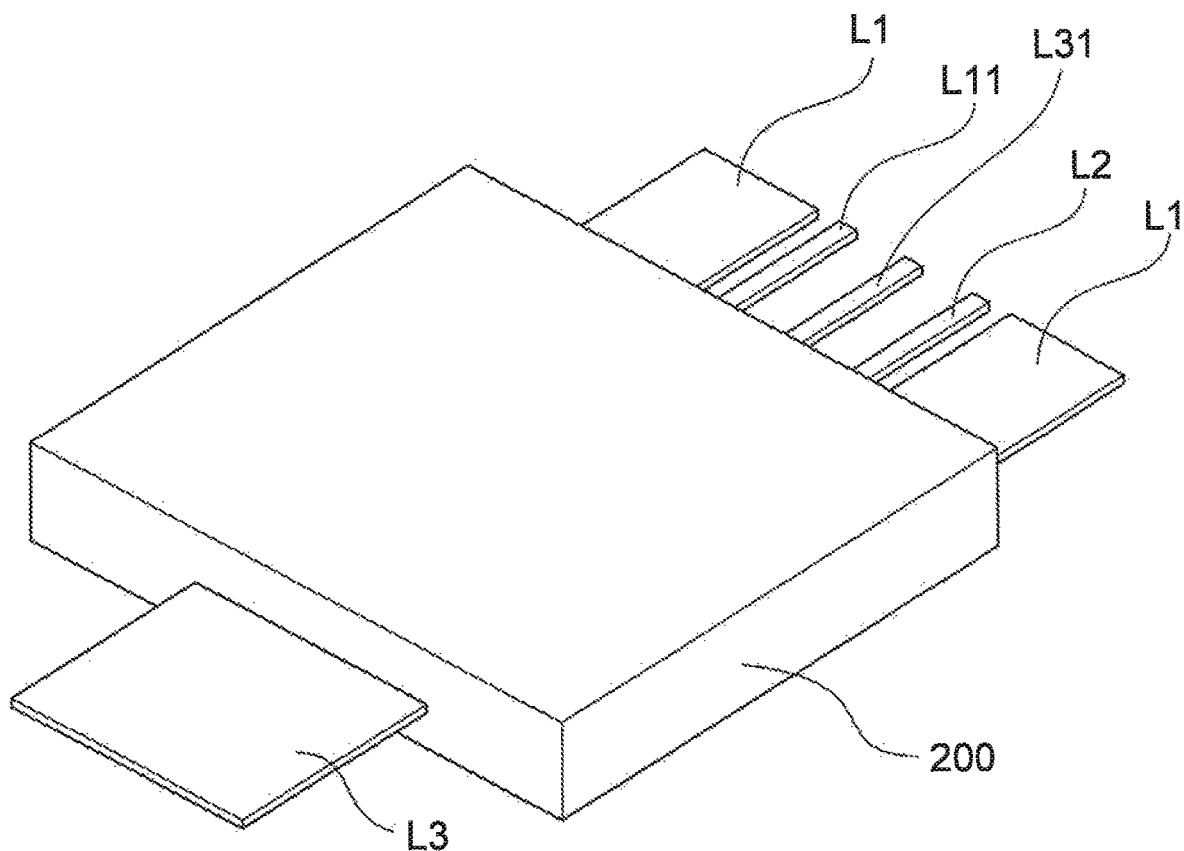
FIG. 4 is a perspective view showing an example of the configuration of the semiconductor device 100 after the lead frame is cut.

FIG. 1 is a perspective view showing an example of a configuration of a semiconductor device 100 before sealing. FIG. 2 is a top view showing an example of the configuration of the semiconductor device 100 after sealing and before cutting the lead frame. FIG. 3 is a perspective view showing an example of the configuration of the semiconductor device 100 after sealing and before cutting the lead frame. FIG. 4 is a perspective view showing an example of the configuration of the semiconductor device 100 after the lead frame is cut. In the example of FIG. 1, a case where there are two first lead frames L1 is shown. Moreover, the example of FIG. 2 is illustrated as if the sealing member was transmitted.

Figure 5A:
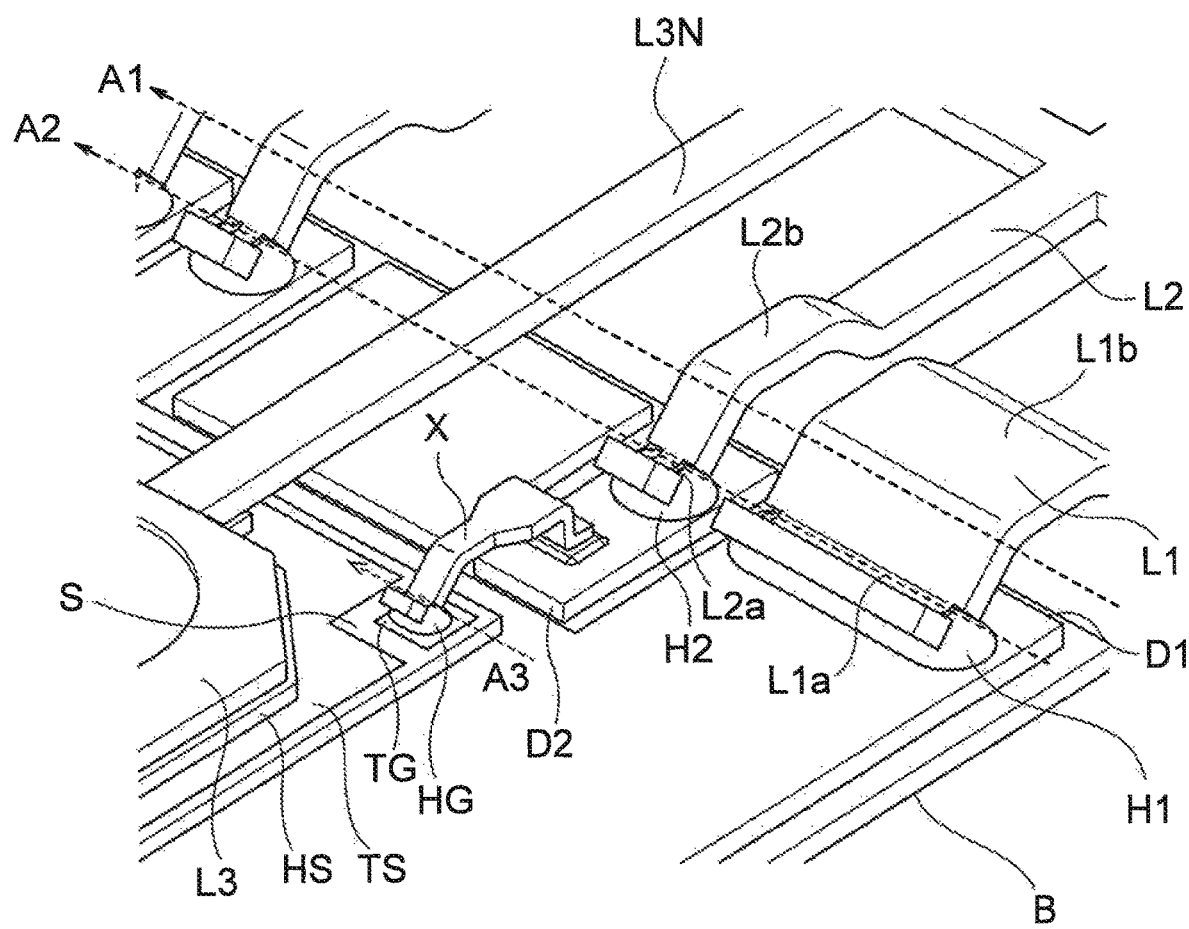
FIG. 5A is an enlarged perspective view of a region in the vicinity of the first and second lead frames L1, L2 and the connector X of the semiconductor device 100 shown in FIG. 1.
Figure 5B:
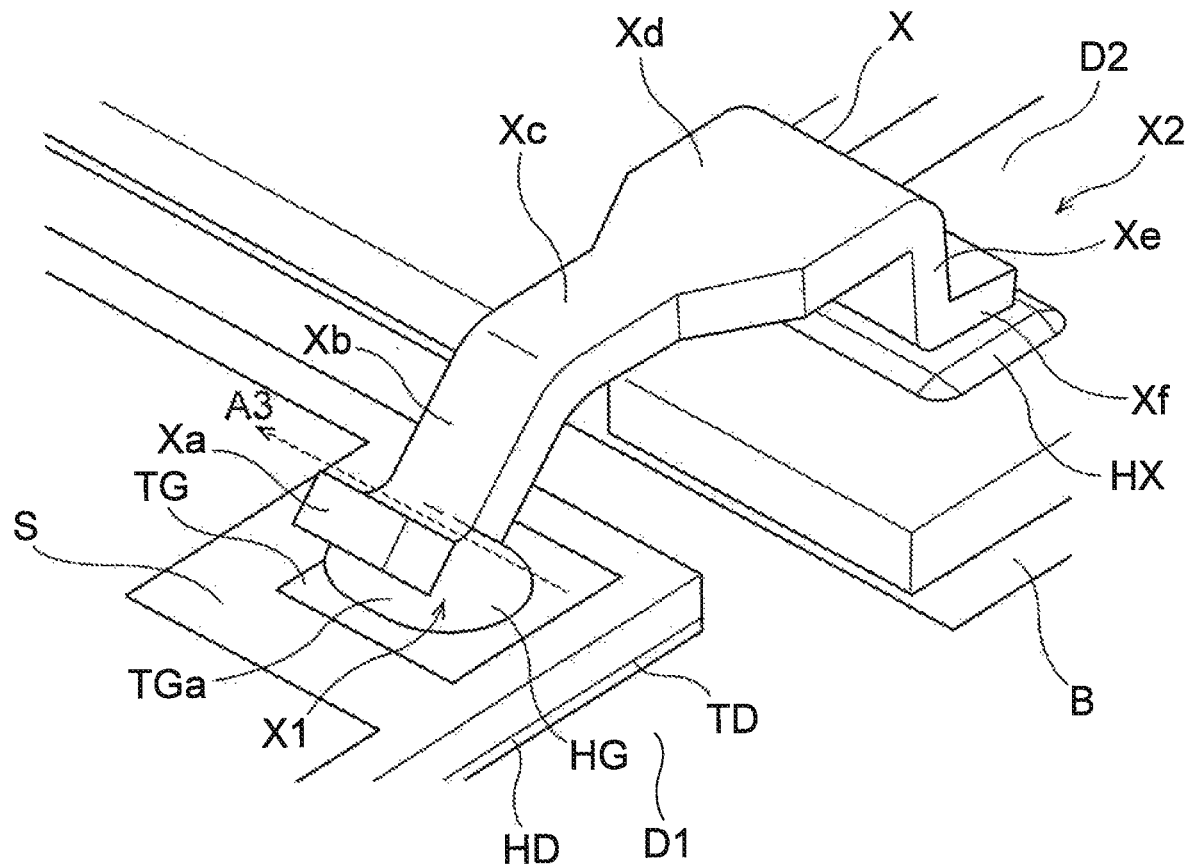
FIG. 5B is a perspective view further enlarging a region in the vicinity of the connector X shown in FIG. 5A.
Figure 5C:
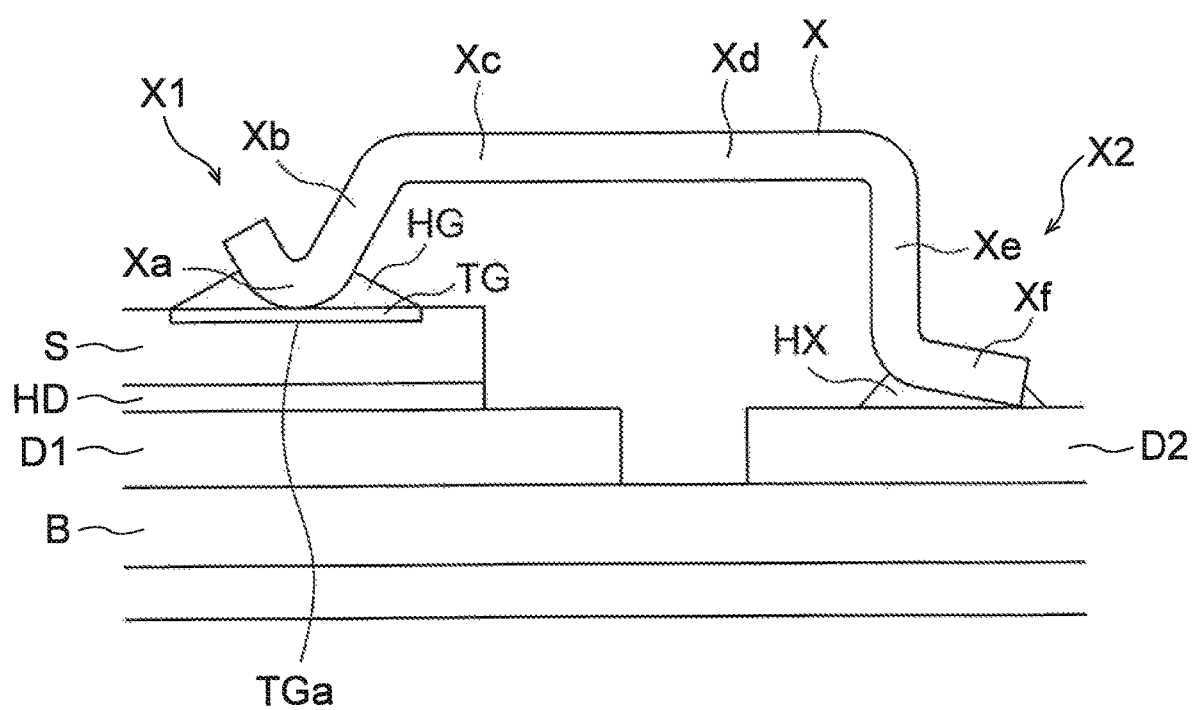
FIG. 5C is a side view showing an example of a side surface of a region in the vicinity of the connector X shown in FIG. 5B.

FIG. 5A is an enlarged perspective view of a region in the vicinity of the first and second lead frames L1, L2 and the connector X of the semiconductor device 100 shown in FIG. 1. FIG. 5B is a perspective view further enlarging a region in the vicinity of the connector X shown in FIG. 5A. FIG. 5C is a side view showing an example of a side surface of a region in the vicinity of the connector X shown in FIG. 5B.

For example, as shown in FIGS. 1 to 4, the semiconductor device 100 includes a substrate B, a semiconductor element S, a sealing portion 200, a first lead frame (a drain lead frame) L1, a detection lead frame. L11, a first conductive bonding material H1, a drain conductive bonding material HD, a second lead frame (control lead frame) L2, a second conductive bonding material (a first control conductive bonding material) H2, a second control conductive bonding material HG, a third control conductive bonding material HX, a source conductive bonding material HS, a connector X, a third lead frame (a source lead frame) L3, and a detection lead frame L31.

As shown in FIGS. 1 and 2, the substrate B is provided with a plurality of conductive layers (a first conductive layer D1 and a second conductive layer D2) on the upper surface of the substrate B.

Also, as shown in FIGS. 1 and 2, the semiconductor element S is disposed on the upper surface of the substrate B. In the semiconductor element S, the first terminal TD on the lower surface side of the semiconductor element S is electrically connected to the first conductive layer D1 provided on the upper surface of the substrate B.

For example, as shown in FIGS. 1 and 2, the semiconductor element S includes a first terminal (a drain terminal) TD, a second terminal (a gate terminal) TG, and a third terminal (a source terminal) TS.

The first terminal TD is provided on the lower surface of the semiconductor element S, and is electrically connected to the first conductive layer D1.

The second terminal TG is provided on the upper surface of the semiconductor element S, and a control signal (a gate signal) is input to the second terminal TG.

Note that the semiconductor element S is, for example, a MOSFET. In this case, the semiconductor element S is a MOSFET having a first terminal TD which is a drain terminal is provided on a lower surface of the MOSFET, a second terminal TG which is a gate terminal is provided on the upper surface of the MOSFET, and a third terminal TS which is a source terminal on the upper surface of the MOSFET.

The semiconductor element S may be other semiconductor elements such as IGBT other than MOSFET.

As shown in FIGS. 1 and 2, the first lead frame L1 has one end L1M electrically connected to the first terminal TD which is a drain terminal in the sealing portion 200, and has the other end L1N exposed from the sealing portion 200.

In particular, the one end portion L1M of the first lead frame L1 is in contact with the upper surface of the first conductive layer D1 at the end extending in the side direction A1 of the upper surface of the substrate B in the sealing portion 200. And, the other end portion L1N of the first lead frame L1 is exposed from the sealing portion 200.

The one end portion L1M of the first lead frame L1 includes a first arch portion L1b and a first bent portion L1a.

The first arch portion L1b is provided so as to protrude upward along the reference direction A2.

And, the first bending portion L1a is connected with the first arch portion L1b, and is located in the tip end side rather than the first arch portion L1b. Furthermore, the first bent portion L1a is bent so as to protrude downward along the reference direction A2.

The lower surface side of the first bent portion L1a is in line contact with the upper surface of the first conductive layer D12 along the reference direction A2.

Further, the first conductive bonding material H1 bonds between the upper surface of the first conductive layer D1 and the lower surface side of the one end L1M of the first lead frame L1 at the end of the substrate B. Furthermore, the first conductive bonding material H1 has electrical conductivity.

Note that the first conductive bonding material H1 is, for example, a solder material.

Further, one end of the detection lead frame L11 is electrically connected to the first terminal TD which is a drain terminal in the sealing unit 200. Furthermore, the other end portion of the detection lead frame L11 is exposed from the sealing portion 200.

The detection lead frame L11 is for detecting the drain voltage of the semiconductor element S, for example.

Then, the detection conductive bonding material H11 bonds the first conductive layer D1 and one end portion of the detection lead frame L11. Further, the detection conductive bonding material H11 has electrical conductivity.

Note that the conductive bonding material for detection H11 is, for example, a solder material.

For example, as shown in FIGS. 1 and 2, one end portion L2M of the second lead frame L2 is in contact with the upper surface of the second conductive layer provided at the end of the upper surface of the substrate B in the sealing portion 200. Further, the other end portion L2N of the second lead frame L2 is exposed from the sealing portion 200.

The second lead frame L2 is a control lead frame for transmitting the gate signal of the MOSFET (the semiconductor element S) described above.

Then, the second conductive bonding material (the first control conductive bonding material) H2 bonds between the first conductive layer D1 and the one end L2M of the second lead frame L2 at the end of the substrate B. Further, the second conductive bonding material (the first control conductive bonding material) H2 has electrical conductivity.

Note that the second conductive bonding material H2 is, for example, a solder material.

Also, the one end portion L2M of the second lead frame L2 includes a second arch portion L2b and a second bent portion L2a.

The second arch portion L2b is provided so as to protrude upward along the reference direction A2.

The second bent portion L2a is connected to the second arch portion L2b and is located on the tip side with respect to the second arch portion L2b. The second bent portion L2a is bent so as to protrude downward along the reference direction A2.

The lower side of the second bent portion L2a is in line contact with the upper surface of the second conductive layer D2 along the reference direction A2.

Further, the width in the reference direction A2 of the one end portion DM of the first lead frame L1 is set to be larger than the width in the reference direction A2 of the one end portion L2M of the second lead frame L2.

Also, one end L3M of the third lead frame L3 is electrically connected to the third terminal TS which is the source terminal on the upper surface of the semiconductor element S. Furthermore, the other end L3N of the third lead frame L3 is exposed from the sealing portion 200.

Then, the source conductive bonding material HS bonds between the third terminal TS and the one end L3M of the third lead frame L3. Further, the source conductive bonding material HS has electrical conductivity.

The source conductive bonding material HS is, for example, a solder material.

The one end of the detection lead frame L31 is electrically connected to the third terminal TS that is the source terminal on the upper surface of the semiconductor element S (that is, the one end of the detection lead frame L31 extends from the third lead frame L3). Further, the other end portion of the detection lead frame L31 is exposed from the sealing portion 200.

The detection lead frame L31 is for detecting the voltage of the source of the semiconductor element S, for example.

Further, as shown in FIGS. 1 to 4, the sealing portion 200 is configured to seal the substrate B and the semiconductor element S.

First Example

Here, in the example shown in FIGS. 5A, 5B, and 5C, the area of the source terminal, that is the third terminal TS on the upper surface of the semiconductor element S, is larger than the area of the second terminal TG that is the gate terminal.

The connector X is electrically connected between the second conductive layer D2 and the second terminal (gate terminal) TG on the upper surface side of the semiconductor element S, as shown in FIGS. 5A, 5B and 5C, for example.

For example, as shown in FIGS. 5A, 5B, and 5C, the connector X has one end X1 in contact with the upper surface of the second terminal TG of the semiconductor element S in the sealing portion 200, and has the other end X2 in contact with the second conductive layer D2.

Here, the second control conductive bonding material HG bonds between the upper surface of the second terminal TG of the semiconductor element S and the one end portion X1 of the connector X. Further, the second control conductive bonding material HG has electrical conductivity.

Note that the second control conductive bonding material HG is, for example, a solder material.

Further, the third control conductive bonding material HX bonds between the second conductive layer D2 of the substrate B and the other end X2 of the connector X. Furthermore, the third control conductive bonding material HX has conductivity.

Note that the third control conductive bonding material HX is, for example, a solder material.

That is, the connector X is configured to electrically connect the second conductive layer D2 and the second terminal (gate terminal) TG on the upper surface side of the semiconductor element S, by the second and third control conductive bonding materials HG and HX, The one end X1 of the connector X includes, for example, a horizontal part Xc, a first inclined part Xb, a control bending part Xa, and a reference part Xd, as shown in FIGS. 5B and 5C.

The horizontal portion Xc is arranged in parallel with the upper surface of the substrate B, for example, as shown in FIGS. 5A, 5B, and 5C.

For example, as shown in FIG. 5A, FIG. 5B, and FIG. 5C, the first inclined portion Xb is connected to the horizontal portion Xc, and is located closer to the tip end of the one end portion X1 than the horizontal portion Xc. In addition, the first inclined portion Xb has a shape inclined downward from the horizontal portion Xc.

Furthermore, as shown in FIG. 5B, for example, the control bending portion Xa is connected to the first inclined portion Xb and located at the tip of one end portion X1. Further, the control bending portion Xa is bent so as to protrude downward along the bending axis direction A3.

The lower surface of the control bending portion Xa is in contact with the upper surface of the second terminal TG. In particular, the lower surface side of the control bending portion Xa is in contact with the center TGa of the upper surface of the second terminal TG.

Further, the lower surface side of the control bending portion Xa is in line contact with the upper surface of the second terminal TG in the bending axis direction A3, for example, as shown in FIG. 5C.

The width of the control bending portion Xa in the bending axis direction A3 is the same as the width of the first inclined portion Xb in the bending axis direction A3.

In addition, the reference portion Xd is connected to the horizontal portion Xc on the side opposite to the first inclined portion Xb, and has a width larger than the width of the horizontal portion Xc.

The width of the bending portion for control Xa in the bending axis direction A3 is set to be narrower than the width of the bending portion in the bending axis direction A3 of the reference portion Xd.

Here, the second control conductive bonding material HG is arranged, along the bending axis direction A3 where the control bending portion Xa of the connector X makes line contact with the upper surface of the second terminal TG, for example, as shown in FIGS. 5A, 5B, and 5C. Furthermore, the second control conductive bonding material HG bonds the upper surface of the second terminal TG and the lower surface side of the control bent portion Xa.

Here, for example, as shown in FIGS. 5A to 5C, the upper surface of the second terminal TG has a rectangular shape.

The second control conductive bonding material HG is positioned so as to surround the center TGa on the upper surface of the second terminal TG, as shown in FIG. 5B. Thus, the second control conductive bonding material HG bonds the lower surface of the control bending portion Xa of the connector X and the upper surface of the second terminal TG.

For example, as shown in FIG. 5C, the lower surface side of the control bending portion Xa of the connector X and the upper surface of the second terminal TG are in line contact with the bending axis direction A3 passing through the center TGa on the upper surface of the second terminal TG.

The bending axis direction A3 is parallel to one side of the rectangle of the second terminal TG as shown in FIGS. 5A, 5B, and 5C, for example.

Meanwhile, the other end portion X2 of the connector X includes a second inclined portion Xe and a tip end portion Xf.

The second inclined portion Xe is connected to the reference portion Xd on the side opposite to the horizontal portion Xc, and is located closer to the tip end side of the other end portion X2 than the reference portion Xd. Furthermore, the second inclined portion Xe has a shape inclined downward from the reference portion Xd.

And, the tip end portion Xf is connected to the second inclined portion Xe, and the tip end portion Xf is located at the tip of the other end X2, as shown in FIGS. 5A, 5B, and 5C, for example.

The tip portion Xf is bonded to the upper surface of the second conductive layer D2 of the substrate B, by the third control conductive bonding material HX.

The height of the lower surface of the control bending portion Xa of the connector X from the upper surface of the substrate B is set to be higher than the height of the lower surface of the tip end portion Xf from the upper surface of the substrate B.

Note that the thickness in the vertical direction of the connector X is set to be thinner than the thickness in the vertical direction of the second lead frame L2.

Thereby, the bending process of the miniaturized connector X can be facilitated.

Second Example

Figure 6:
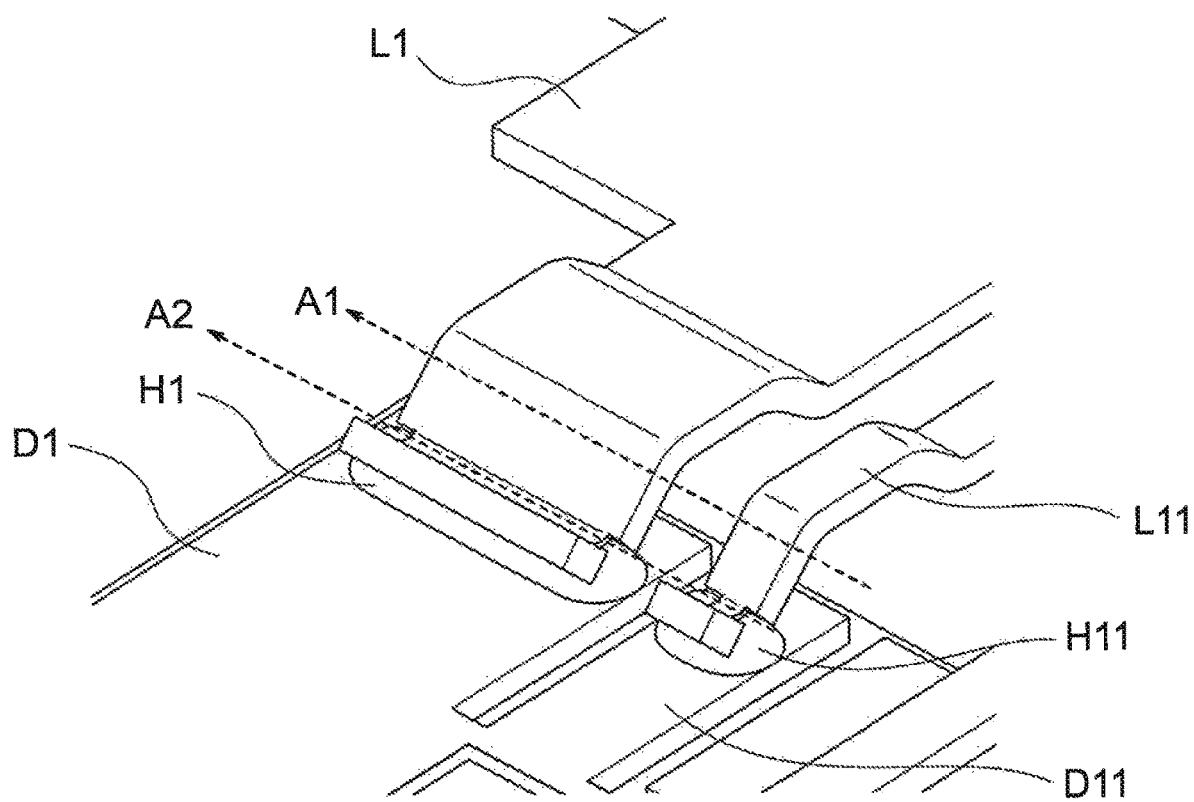
FIG. 6 is an enlarged perspective view of a region in the vicinity of the first lead frame L1 and the detection lead frame L11 of the semiconductor device 100 shown in FIG. 1.
Figure 7:
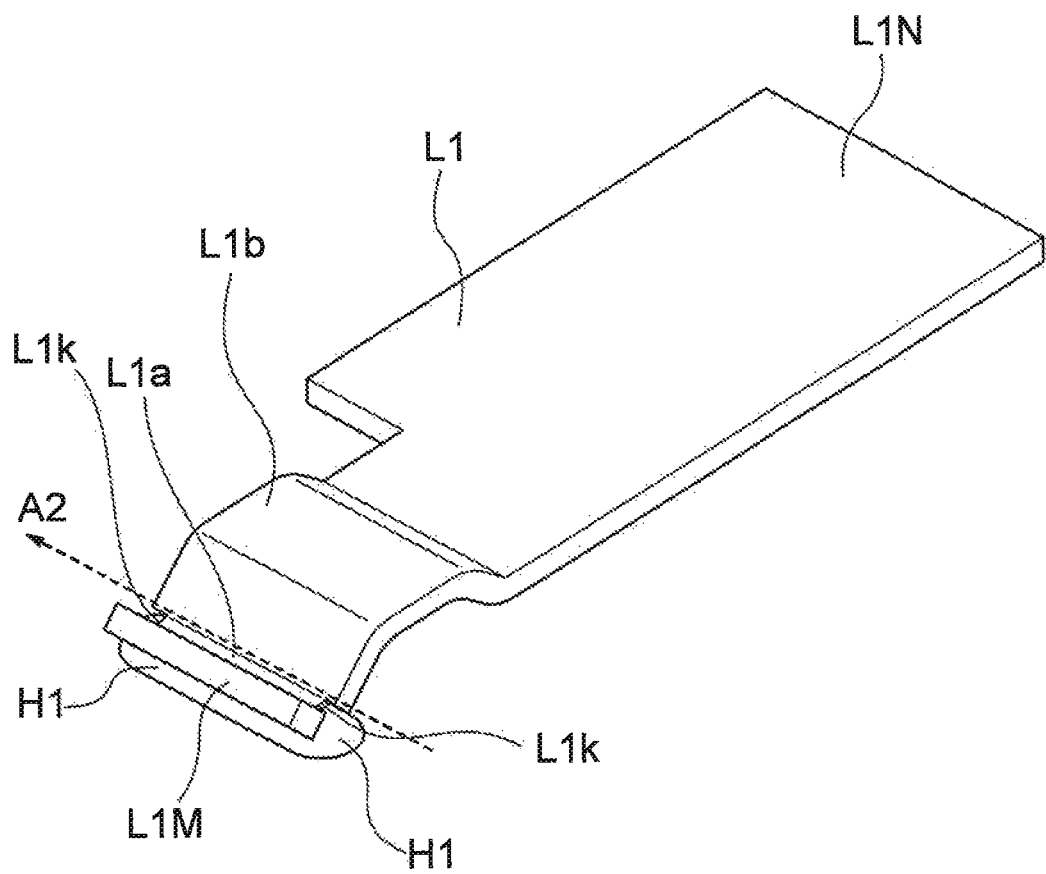
FIG. 7 is a perspective view showing an example of the configuration of the first lead frame L1 and the first conductive bonding material H1 shown in FIG. 6.
Figure 8A:
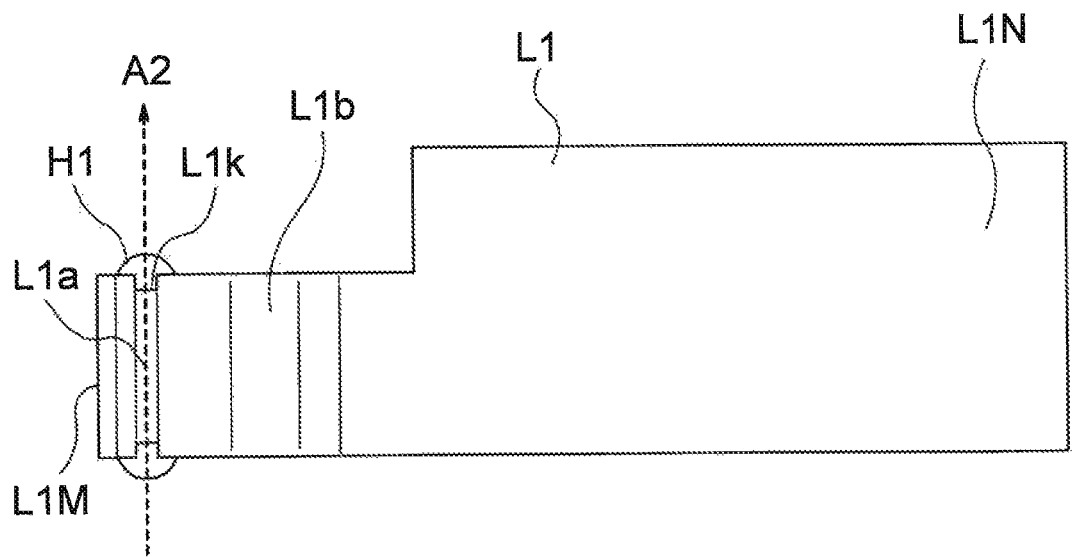
FIG. 8A is a top view showing an example of the configuration of the first lead frame L1 and the first conductive bonding material H1 shown in FIG. 7.
Figure 8B:
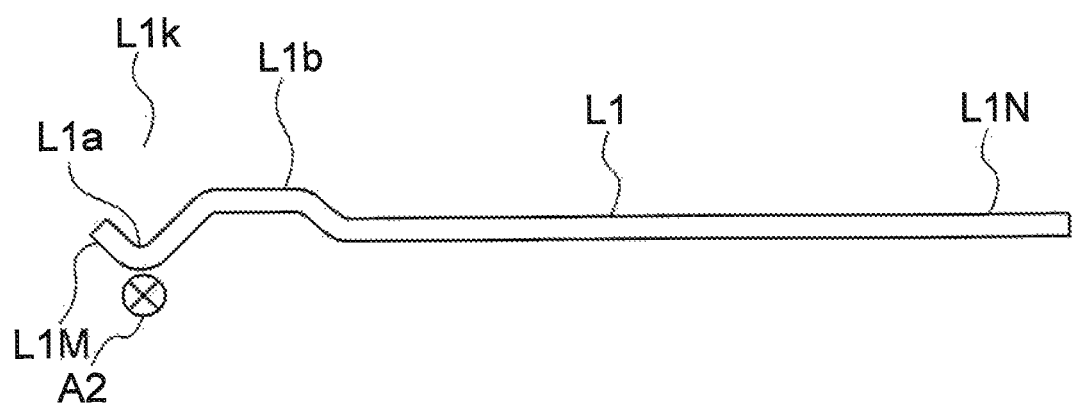
FIG. 8B is a cross-sectional view showing an example of the configuration of the first lead frame L1 shown in FIG. 8A.
Figure 9:
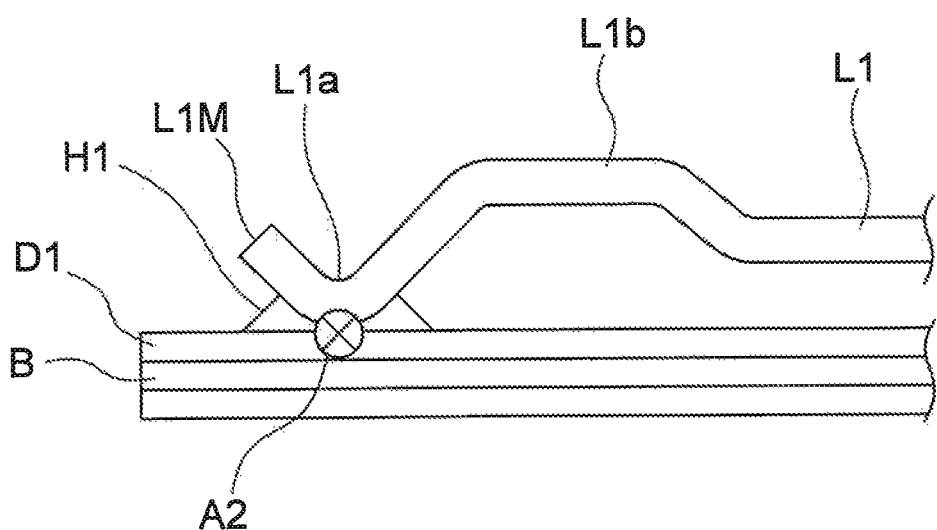
FIG. 9 is a cross-sectional view showing an example of the configuration in the vicinity of one end DM of the first lead frame L1 shown in FIG. 9.

FIG. 6 is an enlarged perspective view of a region in the vicinity of the first lead frame L1 and the detection lead frame L11 of the semiconductor device 100 shown in FIG. 1. FIG. 7 is a perspective view showing an example of the configuration of the first lead frame L1 and the first conductive bonding material H1 shown in FIG. 6. FIG. 8A is a top view showing an example of the configuration of the first lead frame L1 and the first conductive bonding material H1 shown in FIG. 7. FIG. 8B is a cross sectional view showing an example of the configuration of the first lead frame L1 shown in FIG. 8A. FIG. 9 is a cross sectional view showing an example of a configuration in the vicinity of one end L1M of the first lead frame L1 shown in FIG. 6.

For example, as shown in FIGS. 6 to 9, one end portion L1M of the first lead frame L1 includes a first arch portion L1b and a first bent portion L1a.

The first arch portion L1b is provided so as to protrude upward along the reference direction A2.

The first bent portion L1a is connected to the first arch portion L1b, is located on the tip end side of the first arch portion L1b, and is bent so as to protrude downward along the reference direction A2.

The lower surface of the first bent portion L1a of the first lead frame L1 is in line contact with the upper surface of the first conductive layer D12 along the reference direction A2.

The first conductive bonding material H1 is arranged along the reference direction A2 in which the first bent portion L1a of the first lead frame L1 is in line contact with the upper surface of the first conductive layer D1. The first conductive bonding material H1 bonds between the upper surface of the first conductive layer D1 and the lower surface side of the first bent portion L1a at the end of the substrate B.

Here, as shown in FIGS. 6 to 9, notch potions L1k are formed on the side surfaces on both sides in the reference direction A2 of the portion, in line contact with the first conductive layer D1, of the first bent portion L1a of the first lead frame L1. The notch portions L1k are recessed in the reference direction A2.

And, a part of the first conductive bonding material H1 is embedded in the notch portions L1k. Thereby, the part of first electroconductive joining material H1 has joined between the upper surface of the first conductive layer D1 and the notch portions L1k of the first bending portion L1a.

The first lead frame L1 is arranged, so that the side direction A1, in which the end of the substrate B extends, and the reference direction A2, in which the line contact region of the first bent portion L1a extends, are parallel to each other, for example, as shown in FIGS. 6 to 9.

The first lead frame L1 has a main body portion that is located between the one end portion L1M and the other end portion L1N, and the main body portion is sealed in the sealing portion 200. And, the position of the upper surface of the first arch portion L1b is higher than the position of the upper surface of the said main body portion.

The width in the side direction A1 of the first arch portion L1b is the same as the width in the side direction A1 other than the cutout portion L1k of the first bent portion L1a. That is, the width in the side direction A1 of the first arch portion L1b is larger than the width in the side direction A1 of the cutout portion L1k of the first bent portion L1a.

Note that the position of the lower surface of the first bent portion L1a is set to be lower than the position of the lower surface of the main body portion.

The position of the lower surface of the first bent portion L1a is set to be lower than the position of the lower surface of the main body.

The first arch portion L1b suppresses the application of stress to the first bent portion L1a of the first lead frame L1, by releasing the stress applied to the first lead frame L1 to the surrounding sealing portion 200.

Third Example

In the third example, an example of a method of manufacturing the semiconductor device 100 having the configuration as described above will be described.

FIGS. 10 to 13 are diagrams illustrating an example of a process of a method of manufacturing the semiconductor device 100.

Figure 10:
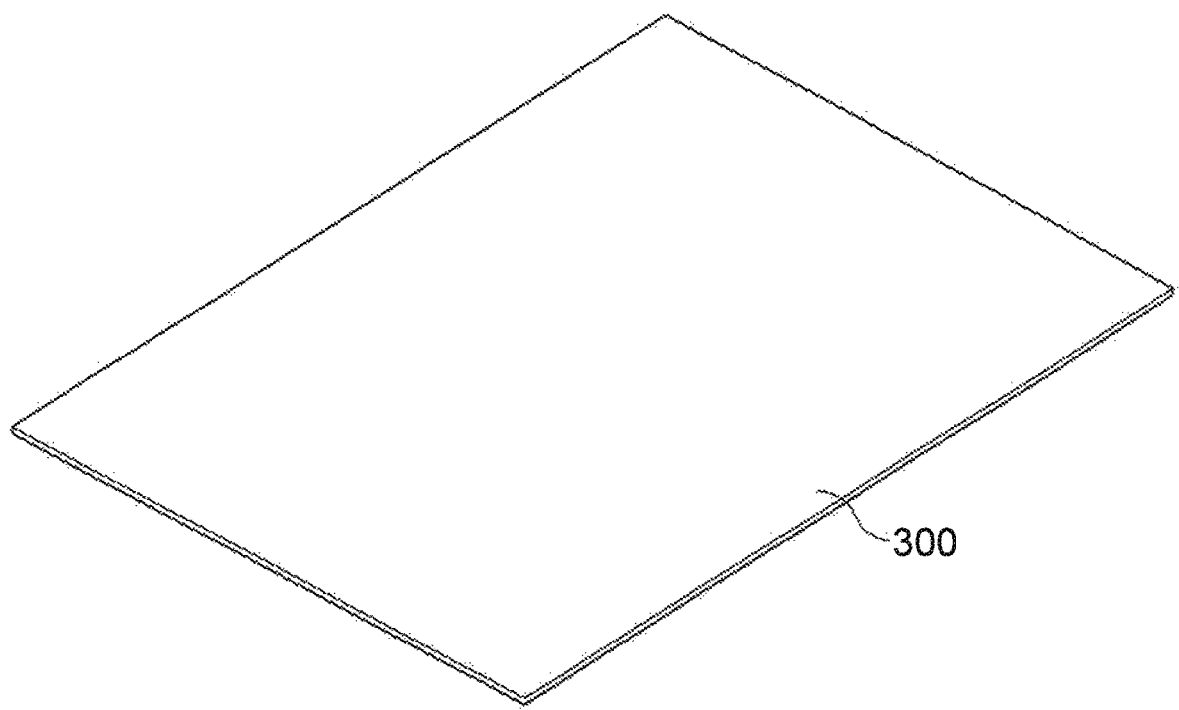
FIG. 10 is a diagram illustrating an example of a process of a method of manufacturing the semiconductor device 100.

First, as shown in FIG. 10, for example, a metal plate 300 made of a metal such as copper is prepared.

Figure 11:
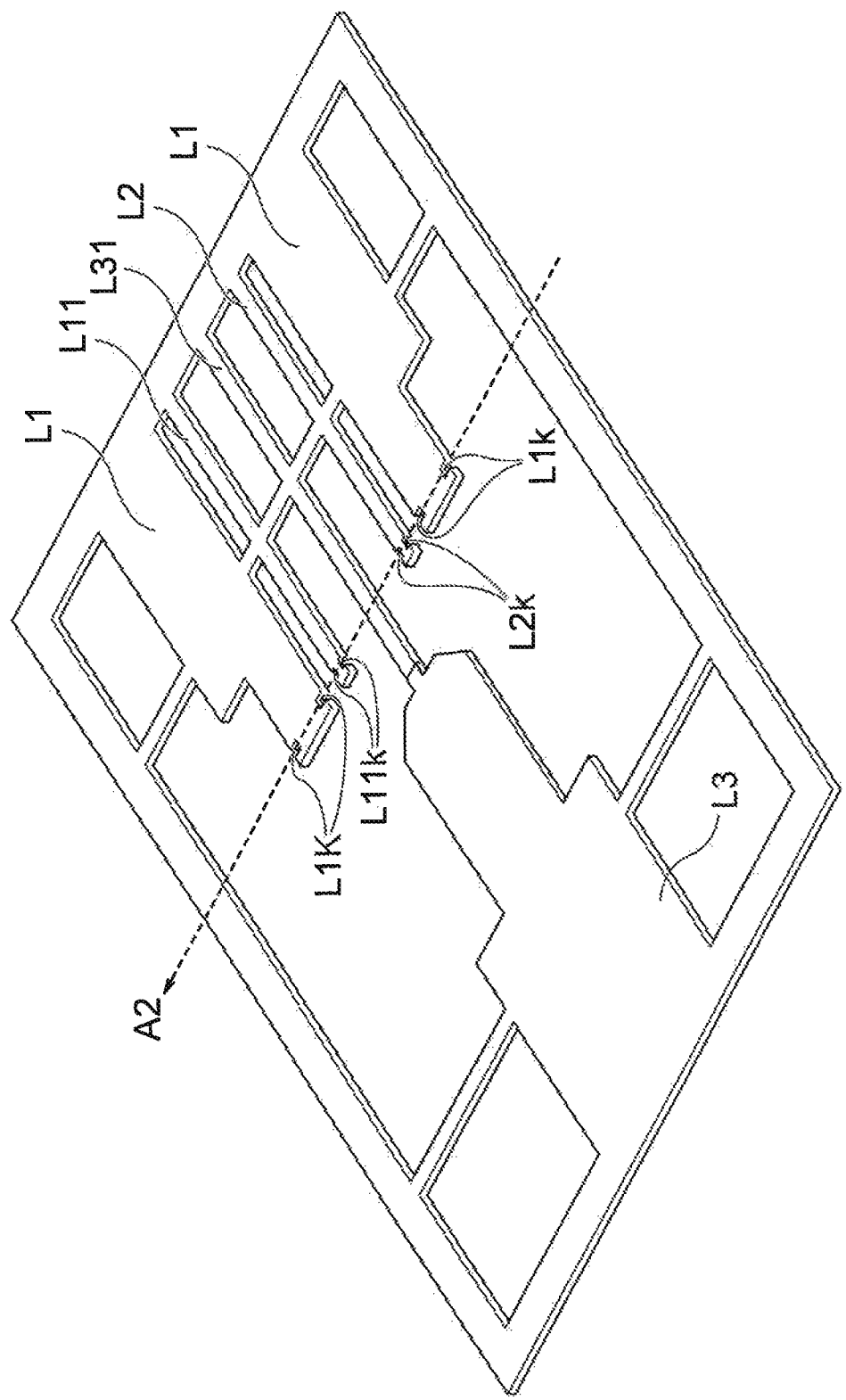
FIG. 11 is a diagram illustrating an example of a process of the method of manufacturing the semiconductor device 100 subsequent to FIG. 10.

Then, as shown in FIG. 11, by selectively punching out the metal plate 300, the first to third lead frames L1 to L3 are simultaneously formed.

In particular, when the first lead frame L1 is formed, notch portions L1$k$ are formed on both side surfaces in the reference direction A2 of the portion, where the first bent portion L1$a$ of the first lead frame L1 is formed, that is in line contact with the first conductive layer D1. The notch portions L1$k$ are recessed in the reference direction A2.

In the same way, when the second lead frame L2 is formed, notch portions L2$k$ are formed on both side surfaces in the reference direction A2 of the portion, where the second bent portion L2$a$ of the second lead frame L2 is formed, that is in line contact with the second conductive layer D2. The notch portions L2$k$ are recessed in the reference direction A2.

Figure 12:
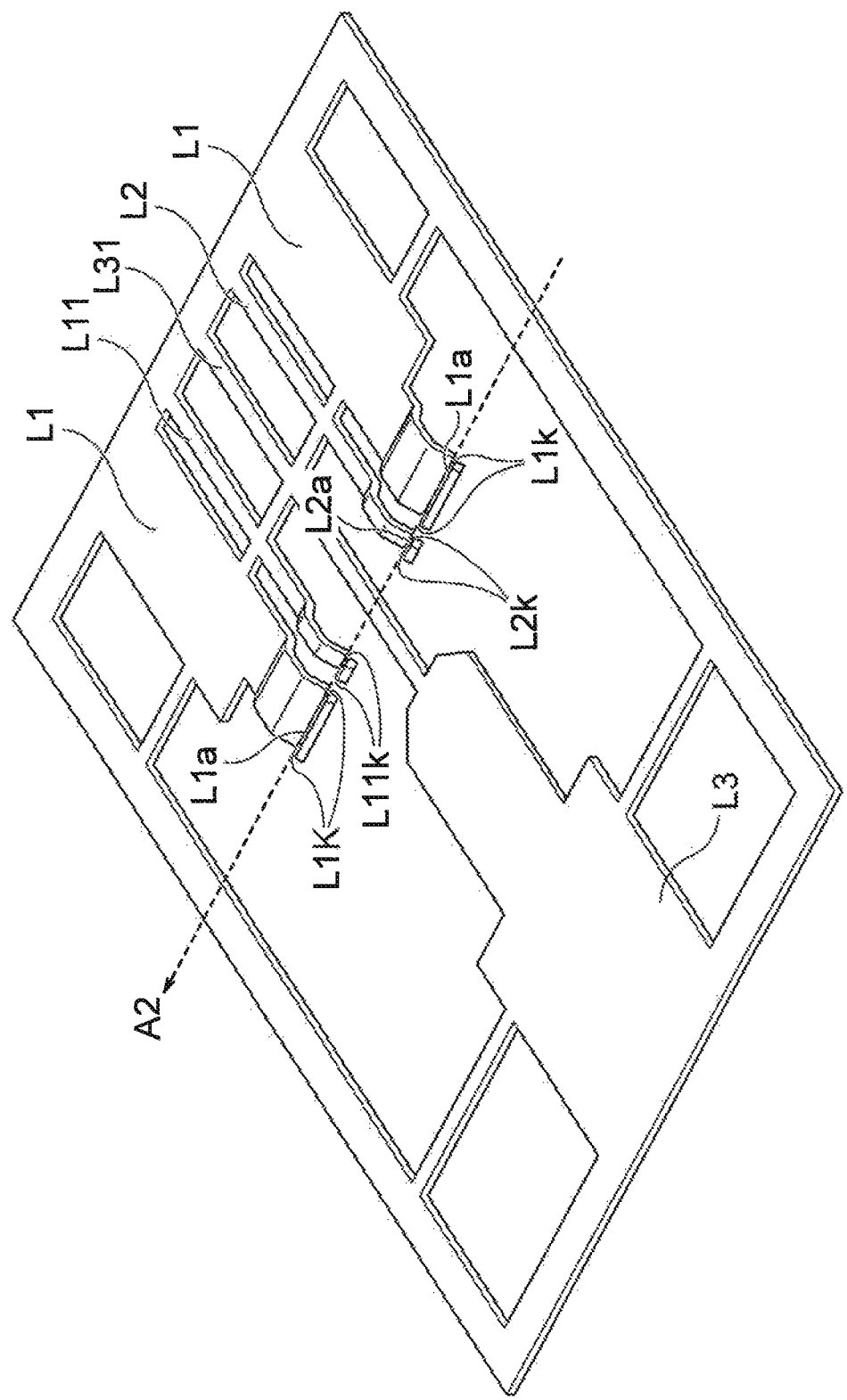
FIG. 12 is a diagram illustrating an example of a process of the method of manufacturing the semiconductor device 100 subsequent to FIG. 11.

Then, as shown in FIG. 12, the one end of the first and second lead frame L1, L2 are bent so as to protrude downward along the reference direction A2. Thereby, the first and second bending portion L1$a$, L2$a$ are formed.

Figure 13:
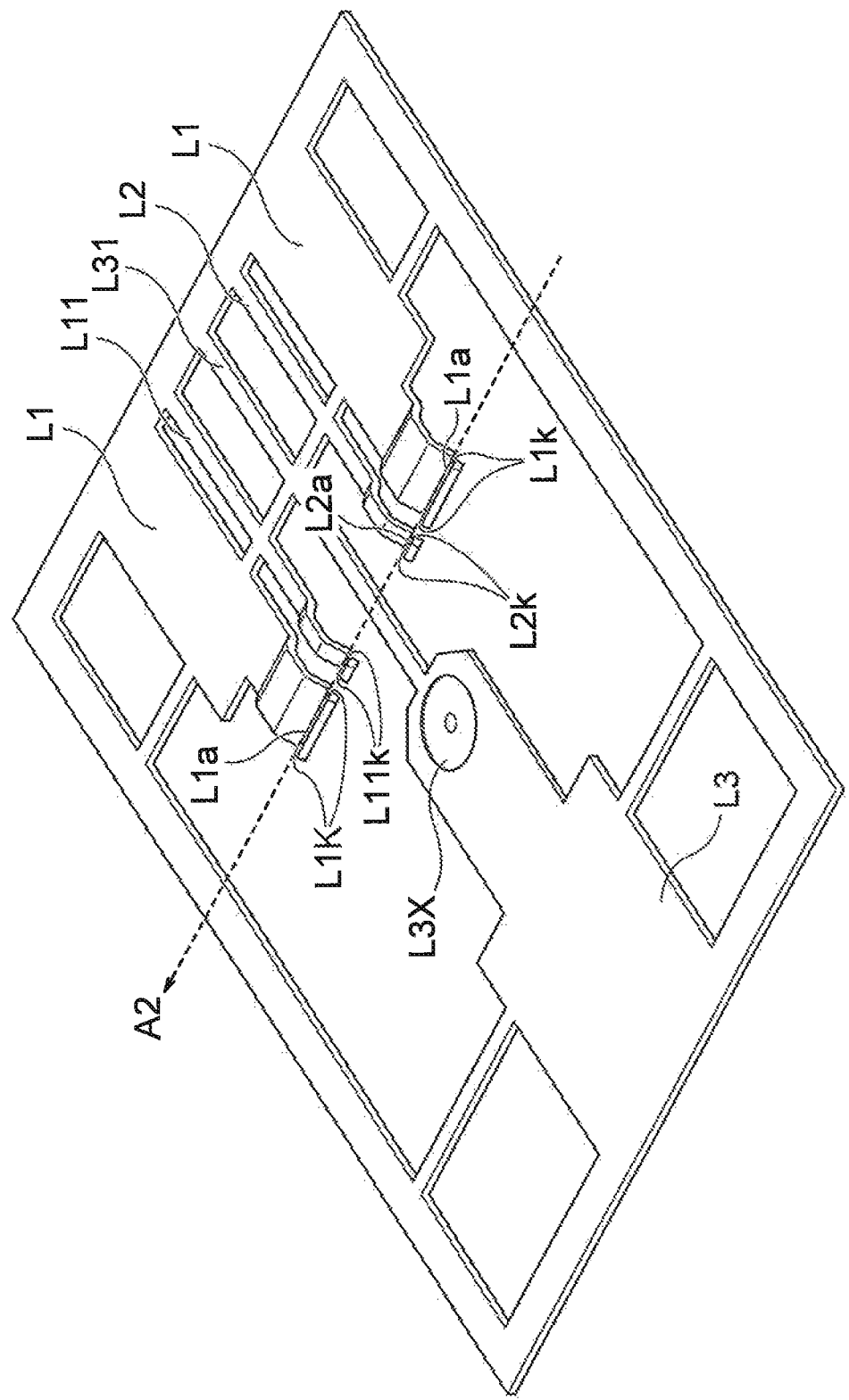
FIG. 13 is a diagram illustrating an example of a process of the method of manufacturing the semiconductor device 100 subsequent to FIG. 12.
Figure 14A:
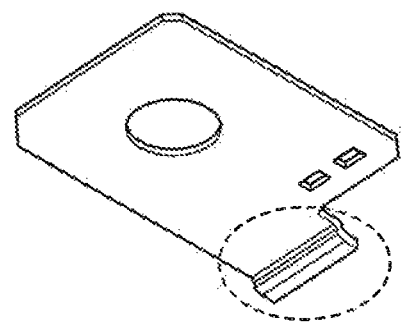
FIG. 14A is a perspective view showing an example of a lead frame applied to a conventional semiconductor device.
Figure 14B:
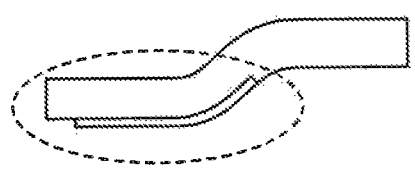
FIG. 14B is a side view showing the side surface of the lead frame shown in FIG. 14A.

Then, as shown in FIG. 13, the third lead frame L3 is subjected to predetermined processing to form a predetermined shape L3X.

Through these steps, for example, the first to third lead frames L1 to L3 shown in FIG. 1 are formed.

Meanwhile, a substrate B having a first conductive layer D1 and a second conductive layer D2 provided on the upper surface is prepared.

Then, the semiconductor element S is arranged on the upper surface of the substrate B. The semiconductor element S has a first terminal TD provided on the lower surface and electrically connected to the first conductive layer D1, and has a second terminal TG provided on the upper surface and to which a control signal is input. Then, by joining the first terminal TD to the first conductive layer D1, the first conductive layer D1 and the first terminal TD are electrically connected.

Thereafter, as shown in FIGS. 5A to 5C, one end of the first lead frame L1 is brought into contact with the upper surface of the first conductive layer D1 provided at the end of the upper surface of the substrate B. Then, the upper surface of the first conductive layer and the lower surface side of the first bent portion of the first lead frame L1 are joined at the end of the substrate B, with the first conductive bonding material H1. Further, a part of the first conductive bonding material H1 is embedded in the notch portions L1$k$. Thereby, the upper surface of the first conductive layer D1 and the notch portions L1$k$ of the first bent portion L1$a$ are joined.

Similarly, one end of the second lead frame L2 is brought into contact with the upper surface of the second conductive layer D2 provided at the end of the upper surface of the substrate B. Then, at the end of the substrate B, the second conductive layer D2 and one end of the second lead frame L2 are joined by the first control conductive bonding material H2 having electrical conductivity (FIG. 1). At this time, a part of the second conductive bonding material H2 is embedded in the notch portions L2$k$. Thereby, the upper surface of the second conductive layer D2 and the cutout portion L2$k$ of the second bent portion L2$a$ are joined.

Further, the one end portion of the third lead frame L3 is brought into contact with the upper surface of the third terminal TS on the upper surface of the semiconductor element S. Then, the third terminal TS and the one end portion of the third lead frame L3 are joined by the source conductive joint material HS having electrical conductivity (FIG. 1).

Then, one end X1 of the connector X is brought into contact with the upper surface of the second terminal TG of the semiconductor element S. Further, the other end X2 of the connector X is brought into contact with the second conductive layer D2. Further, the upper surface of the second terminal of the semiconductor element S and the one end portion X1 of the connector X are bonded by the second control conductive bonding material HG having electrical conductivity. Furthermore, the second conductive layer D2 of the substrate B and the other end portion X2 of the connector X are joined by the third conductive control material HX having electrical conductivity.

Then, as shown in FIGS. 2 and 3, the substrate B, the semiconductor element S, the connector X, the first to third lead frames L1 to L3, and the one end of detection lead frames L11 and L31 are sealed by the sealing portion 200.

Thereafter, by cutting the first to third lead frames L1 to L3 and the detection lead frames L11 and L31, the semiconductor device 100 shown in FIG. 4 is manufactured.

Thus, in this embodiment, after the outer shape of the metal plate 300 is punched, the first and second lead frames L1 and L2 can be formed by two steps of bending the one end of the first and second lead frames L1 and L2. For this reason, the processing cost is reduced, and the thickness of the solder is ensured at the outer peripheral portion of the joint portion, so that stress relaxation is possible.

Further, by forming notch portions (the recessed portions) L1$k$ and L2$k$ on both sides of the first and second bent portions L1$a$ and L2$a$ at the tip (the one end portion) of the first and second lead frames L1 and L2, the first and second bent portions L1$a$ and L2$a$ can be easily bent. Furthermore, since the solder flows into the notch portions L1$k$ and L2$k$, the fixing by the solder can be ensured.

As described above, the tip of the first and second lead frames L1 and L2 are bent by bending. Thus, the bent first and second bent portions L1$a$ and L2$a$ are connected to the first and second conductive layers D1 and D2 by the line contact. For this reason, it is possible to reduce the amount of solder material dispensed.

The method of manufacturing the semiconductor device according to one embodiment of the present invention, is the method of manufacturing the semiconductor device comprising: a substrate B on which a plurality of conductive layers D1, D2 are provided; a semiconductor element S that has a first terminal on a lower surface side of the semiconductor element, the first terminal electrically connected to a first conductive layer provided on a upper surface of the substrate; a sealing portion that seals the substrate and the semiconductor element; a first lead frame that has one end portion contacting the upper surface of the first conductive layer at an end extending in a side direction of the upper surface of the substrate in the sealing portion, and has the other end portion exposed from the sealing portion; a first conductive bonding material that bonds between the upper surface of the first conductive layer and the lower surface of the one end of the first lead frame at the end of the substrate, and that has electrical conductivity; wherein the one end portion of the first lead frame has a first bent portion Da bent so as to protrude downward along a reference direction A2.

The method of manufacturing the semiconductor device according to one embodiment of the present invention includes: in a first step of the method, a portion to be the first lead frame is formed by selectively punching a metal plate, furthermore, notch portions depressed in the reference direction are formed on both side surfaces of a portion, of the first lead frame where the first bent portion is formed, in line contact with the first conductive layer in the reference direction; in the second step of the method, a first bent portion is formed by bending the one end of the first lead frame so as to protrude downward along the reference direction; and in the third step of the method, the upper surface of the first conductive layer and the lower surface of the first bent portion of the first lead frame are joined at the end of the substrate, by the first conductive bonding material, furthermore, the upper surface of the first conductive layer and the notch portions of the first bent portion are joined, by embedding a part of the first conductive bonding material in the notch portions.

Thus, in the method of manufacturing a semiconductor device of the present invention, two steps, that are a process of selectively punching a metal plate and a process of bending one end of the first lead frame, are sufficient as the step of forming the first lead frame L1. For this reason, manufacturing costs can be reduced.

Further, a predetermined thickness of the first conductive bonding material is secured on an outer peripheral portion of a bonding portion between the lead frame and the substrate. For this reason, when thermal stress is applied, the stress generated in the joint can be reduced.

In particular, the tip of the first lead frame to be bonded to the substrate is bent to form a first bent portion, and the first bent portion is in line contact with the substrate. For this reason, it becomes possible to ensure a predetermined thickness of the first conductive bonding material around the bonding portion.

Furthermore, a part of the first conductive bonding material is embedded in the notch portions. Thereby, the upper surface of the first conductive layer and the cutout portion of the first bent portion are joined. Thereby, fixation by solder can be ensured.

That is, in the method of manufacturing a semiconductor device of the present invention, the stress generated at the joint between the lead frame and the substrate can be relaxed, and the reliability of the joint can be improved. Furthermore, the lead frame can be easily formed and the manufacturing cost can be reduced.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor device
B: substrate
S: semiconductor element
200: sealing portion 200
L1: first lead frame
L11: detection lead frame
H1: first conductive bonding material
L2: second lead frame (control lead frame)
H2: second conductive bonding material (a first control conductive bonding material)
HG: second control conductive bonding material
HX: third control conductive bonding material
X: connector
L3: third lead frame (a source lead frame)
L31: detection lead frame

What is claimed:

1. A method of manufacturing a semiconductor device, the semiconductor device comprising:
    a substrate on which a plurality of conductive layers are provided;
    a semiconductor element that has a first terminal on a lower surface side of the semiconductor element, the first terminal electrically connected to a first conductive layer provided on a upper surface of the substrate;
    a sealing portion that seals the substrate and the semiconductor element;
    a first lead frame that has one end portion contacting the upper surface of the first conductive layer at an end extending in a side direction of the upper surface of the substrate in the sealing portion, and has the other end portion exposed from the sealing portion;
    a first conductive bonding material that bonds between the upper surface of the first conductive layer and the lower surface of the one end of the first lead frame at the end of the substrate, and that has electrical conductivity;
    wherein the one end portion of the first lead frame has a first bent portion bent so as to protrude downward along a reference direction, and
    wherein
        in a first step of the method, a portion to be the first lead frame is formed by selectively punching a metal plate, furthermore, notch portions depressed in the reference direction are formed on both side surfaces of a portion, of the first lead frame where the first bent portion is formed, in line contact with the first conductive layer in the reference direction;
        in the second step of the method, a first bent portion is formed by bending the one end of the first lead frame so as to protrude downward along the reference direction; and
        in the third step of the method, the upper surface of the first conductive layer and the lower surface of the first bent portion of the first lead frame are joined at the end of the substrate, by the first conductive bonding material, furthermore, the upper surface of the first conductive layer and the notch portions of the first bent portion are joined, by embedding a part of the first conductive bonding material in the notch portions.

2. The method of manufacturing the semiconductor device according to claim 1, wherein a lower surface of the first bent portion is in line contact with an upper surface of the first conductive layer in the reference direction.

3. The method of manufacturing the semiconductor device according to claim 2,
    wherein the first conductive bonding material is disposed along the reference direction in which the first bent portion of the first lead frame is in line contact with the upper surface of the first conductive layer, and
    wherein the first conductive bonding material bonds the upper surface of the first conductive layer and the lower surface of the first bent portion at the end of the substrate.

4. The method of manufacturing the semiconductor device according to claim 3, wherein the first lead frame is arranged, such that the side direction in which the end of the substrate extends and the reference direction in which a line contact region of the first bent portion extends are parallel to each other.

5. The method of manufacturing the semiconductor device according to claim 4, wherein the first lead frame has a main body located between the one end and the other end of the first lead frame, and the main body sealed in the sealing portion.

6. The method of manufacturing the semiconductor device according to claim 4, wherein the one end and the other end of the first lead frame have the same thickness.

7. The method of manufacturing the semiconductor device according to claim 4, wherein the first conductive bonding material is a solder material.

8. The method of manufacturing the semiconductor device according to claim 3, further comprising:
   a second lead frame that has one end in contact with the upper surface of a second conductive layer provided on the end of the upper surface of the substrate in the sealing portion, and that has the other end exposed from the sealing portion;
   a second conductive bonding material that bonds between the first conductive layer and the one end of the second lead frame at the end of the substrate, and the second conductive bonding material having electric conductivity; and
   a connector that electrically connects between the second conductive layer and a second terminal on the upper surface side of the semiconductor element is further provided.

9. The method of manufacturing the semiconductor device according to claim 8, wherein the semiconductor device is a MOSFET having the first terminal that is a drain terminal, the second terminal is a gate terminal, and a source terminal, which is a third terminal having an area larger than the second terminal, the source terminal provided on an upper surface of the MOSFET.

10. The method of manufacturing the semiconductor device according to claim 9, wherein a width of the one end of the first lead frame in the reference direction is larger than a width of the one end of the second lead frame in the reference direction.

11. The method for manufacturing a semiconductor device according to claim 10, further comprising a third lead frame that has one end electrically connected to the third terminal of the substrate in the sealing portion, and that has the other end exposed from the sealing portion.

12. The method of manufacturing the semiconductor device according to claim 5,
   wherein the one end portion of the first lead frame further includes a first arch provided so as to protrude upward along the reference direction, and
   wherein the first bent portion is connected to the first arch portion and is located closer to the tip end of the one end portion of the first lead frame than the first arch portion.

13. The method of manufacturing the semiconductor device according to claim 12, wherein a width of the first arch portion in the side direction is the same as a width of the first bent portion in the side direction other than the cutout portion.

14. The method of manufacturing the semiconductor device according to claim 13, wherein the first arch portion suppresses application of stress to the first bent portion of the first lead frame, by releasing the stress applied to the first lead frame to the surrounding sealing portion.

15. The method of manufacturing the semiconductor device according to claim 13,
   wherein a position of the upper surface of the first arch portion is higher than the position of the upper surface of the main body portion, and
   wherein a position of a lower surface of the first bent portion is lower than a position of a lower surface of the main body.

* * * * *